United States Patent
Ikeda

(10) Patent No.: US 7,706,173 B2
(45) Date of Patent: Apr. 27, 2010

(54) MEMORY MACRO COMPOSED OF A PLURALITY OF MEMORY CELLS

(75) Inventor: Motohisa Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 11/987,536

(22) Filed: Nov. 30, 2007

(65) Prior Publication Data

US 2008/0170459 A1 Jul. 17, 2008

(30) Foreign Application Priority Data

Jan. 16, 2007 (JP) ............................. 2007-007192

(51) Int. Cl.
*G11C 11/00* (2006.01)
(52) U.S. Cl. ........................ 365/154; 365/226
(58) Field of Classification Search ................. 365/154, 365/226
See application file for complete search history.

(56) References Cited

U.S. PATENT DOCUMENTS

| | | | |
|---|---|---|---|
| 6,292,388 B1 * | 9/2001 | Camarota | 365/156 |
| 6,414,895 B2 * | 7/2002 | Kokubo et al. | 365/227 |
| 7,095,255 B2 * | 8/2006 | Schuelein | 327/57 |
| 2004/0125681 A1 * | 7/2004 | Yamaoka et al. | 365/229 |
| 2004/0156227 A1 * | 8/2004 | Chu et al. | 365/154 |
| 2005/0094474 A1 * | 5/2005 | Deng et al. | 365/229 |
| 2006/0002223 A1 * | 1/2006 | Song et al. | 365/226 |
| 2006/0028896 A1 * | 2/2006 | Yamagami | 365/226 |
| 2007/0121358 A1 * | 5/2007 | Hirota et al. | 365/1 |

FOREIGN PATENT DOCUMENTS

JP 2006-73165 3/2006

* cited by examiner

*Primary Examiner*—Hoai V Ho
(74) *Attorney, Agent, or Firm*—Arent Fox LLP

(57) ABSTRACT

In a memory macro which can more largely reduce a leak current of a memory cell in a hold state, a power voltage between a power potential and a reference potential is supplied across power terminals of each CMOS inverter (across source electrodes of loading P channel FETs and source electrodes of driving N channel FETs) forming the memory cell when a word line is on (high level), a hold enable voltage which is lower than the power voltage and equal to or higher than a lower limit voltage for enabling data to be held (voltage between a potential dropped lower than the power potential and the reference potential) is supplied between the power terminals when the word line is turned off (low level), and the power voltage is constantly supplied to a back gate electrode of one FET within each CMOS inverter.

23 Claims, 12 Drawing Sheets

MEMORY MACRO COMPOSED OF A PLURALITY OF MEMORY CELLS

BACKGROUND OF THE INVENTION

1. Field of the Invention

The present invention relates to a memory macro, and in particular to a memory macro composed of a plurality of memory cells such an SRAM or the like.

2. Description of the Related Art

FIG. 11 shows an arrangement of a generally known memory macro. A plurality of memory macros 10 are mounted on a semiconductor integrated circuit 1 or the like as shown in FIG. 11 and store access data from logical circuits 20. Also, the memory macro 10 is supplied with a voltage (hereinafter, power voltage) equivalent to a potential difference between a power potential (on a high potential end of the power voltage) VDD and a reference potential (on a low potential end of the power voltage) VSS from an outside power control circuit 30.

Also, the memory macro 10 is composed of memory cells 100_11-100_mn (hereinafter, occasionally represented by a reference numeral 100) arranged in "m" rows and "n" columns, word line drivers 200_1-200_m (hereinafter, occasionally represented by a reference numeral 200) connected to the memory cells 100 of the same row by a word line WL, sense/write amplifiers 300_1-300_n (hereinafter, occasionally represented by a reference numeral 300) connected to the memory cells 100 of the same column by bit lines BL, and an address decoder 400 controlling the word line drivers 200 according to an address (not shown) inputted from the logical circuit 20.

As shown in FIG. 12, each of the memory cells 100_11-100_mn forms a flip-flop circuit with a CMOS inverter INV1 where drain electrodes D and gate electrodes G of a loading P channel FET TP1 and those of a driving N channel FET TN1 are mutually connected, and a CMOS inverter INV2 where drain electrodes D and gate electrodes G of a loading P channel FET TP2 and those of a driving N channel FET TN2 are mutually connected. Both source electrodes S and both back gate electrodes BG of the loading P channel FETs TP1 and TP2 are connected to the power potential VDD through a power line VL1. Both source electrodes S and both back gate electrodes BG of the driving N channel FETs TN1 and TN2 are connected to the reference potential VSS through a power line VL3.

Also, the common drain electrodes D of the CMOS inverters INV1 and INV2 are connected to the word line WL and a pair of the bit lines BL through source electrodes S and drain electrodes D of transferring N channel FETs TN3 and TN4. Both gate electrodes G and both back gate electrodes BG of the transferring N channel FETs TN3 and TN4 are respectively connected to the word line WL and the reference potential VSS.

In operation, it is now supposed that the word line drivers 200_1-200_m having been controlled by the address decoder 400 shown in FIG. 11 select only one of the word lines WL1-WLm connected thereto. Namely, as shown in FIG. 12, the word line driver 200_1 makes the word line WL1 a high level H and the other word line drivers 200_2-200_m make the word lines WL2-WLm a low level L.

At this time, the transferring N channel FETs TN3 and TN4 within the memory cells 100_11-100_1n where the gate electrodes G are connected to the word line WL1 are turned on, so that channels are formed between the respective source electrodes S and drain electrodes D. Then, data held by the memory cells 100_11-100_1n is to be read or updated (written) according to logical levels supplied through the bit lines BL from the sense/write amplifiers 300 shown in FIG. 11 (hereinafter, this state is called "access state").

On the other hand, since the transferring N channel FETs TN3 and TN4 within the memory cells 100_21-100_mn where the gate electrodes G are connected to the word lines WL2-WLm are now off, neither reading nor writing the data to the memory cells 100_21-100_mn is performed, so that the data is held (hereinafter, this state is called "hold state").

Recently, with increases of the number of memory macros mounted on the semiconductor integrated circuit and the number of memory cells included in each memory macro, power consumption due to a leak current of the memory macro has occupied a large proportion of the entire circuit power consumption.

Prior art examples [1] and [2] indicating technologies to address this problem will be described as follows:

PRIOR ART EXAMPLE [1]

A technology where the above-mentioned power control circuit 30 supplies, when the whole memory macro 10 is in the hold state, a voltage (hereinafter, hold enable voltage) which is equal to or higher than a lower limit voltage for enabling each of the memory cells 100_11-100_mn to hold the data by dropping the power potential VDD or raising the reference potential VSS, thereby reducing the leak current.

However, when any one of the memory cells within the memory macro is in the access state, the power voltage is also supplied to the memory cells which are in the hold state. Accordingly, there has been another problem that the leak current can not be substantially reduced, so that reduction effect of the power consumption can hardly be achieved.

In order to address this problem, a prior art example [2] which will be described hereinafter has already been proposed.

PRIOR ART EXAMPLE [2]

In the memory macro 10, a voltage control circuit is provided per word line WL, which supplies the memory cells 100 with the power voltage as it is when the word line WL is at the high level H and switches over so as to supply the memory cells 100 with the hold enable voltage when the word line WL is at the low level L (see e.g. patent document 1).

[Patent document 1] Japanese Patent Application Laid-open No. 2006-73165

In the above-mentioned prior art example [2], the leak current is reduced by supplying the hold enable voltage to the memory cells which are in the hold state. However, there has been a further problem that reduction effect of the leak current achieved thereby is insufficient.

SUMMARY OF THE INVENTION

It is accordingly an object of the present invention to provide a memory macro which can more largely reduce a leak current of a memory cell being in a hold state.

[1] In order to achieve the above-mentioned object, a memory macro according to one aspect of the present invention comprises: a memory cell forming a flip-flop circuit with a pair of CMOS inverters connected to a word line and a pair of bit lines; and a voltage control circuit supplying a predetermined power voltage across power terminals of each CMOS inverter when the word line is on, supplying a hold enable voltage which is lower than the power voltage and equal to or higher than a lower limit voltage for enabling data to be held across the power terminals when the word line is turned off, and constantly supplying the power voltage to a back gate electrode of one FET within each CMOS inverter.

Namely, in the present invention, a voltage to be supplied across power terminals of each CMOS inverter is made low in a hold state where a logical level of a word line is turned "L" (the word line is turned off) in the same way as the above-mentioned prior art example [2], whereby a leak current of a memory cell in the hold state is reduced (hereinafter, referred to as low bias effect). However, different from the above-mentioned prior art example [2], the power voltage is supplied to a back gate electrode of one FET within each CMOS inverter to make the one FET in a substrate bias state, so that the leak current can be further reduced (hereinafter, referred to as substrate bias effect).

[2] Also, in the above-mentioned [1], the voltage control circuit may provide a potential dropped lower than a power potential on a high potential end of the power voltage and a reference potential on a low potential side of the power voltage as the hold enable voltage, and the back gate electrode of the one FET may be connected to the power potential.

[3] Also, in the above-mentioned [1], the voltage control circuit may provide a power potential on a high potential end of the power voltage and a potential raised higher than a reference potential on a low potential end of the power voltage as the hold enable voltage, and the back gate electrode of the one FET may be connected to the reference potential.

[4] Also, in the above-mentioned [1], the voltage control circuit may provide a potential dropped lower than a power potential on a high potential end of the power voltage and a potential raised higher than a reference potential on a low potential end of the power voltage as the hold enable voltage, and the back gate electrode of the one FET may be connected to the power potential and a back gate electrode of the other FET may be connected to the reference potential.

Namely, in this case, it is possible to make both FETs within each CMOS inverter in the substrate bias state, thereby enabling the leak current to be drastically reduced.

[5] Also, in the above-mentioned [2], the voltage control circuit may include an inverter inverting a logical level of the word line, a P channel FET where a source electrode, a drain electrode, and a gate electrode are respectively connected to the power potential, one power terminal, and an output of the inverter, thereby being turned on only when the word line is on and making a potential of the one power terminal the power potential, and an element making, when the P channel FET is off, the potential of the one power terminal the potential dropped lower than the power potential by a voltage drop of the element itself.

Thus, it becomes possible to simply configure the voltage control circuit, thereby enabling scale increase of the memory macro to be suppressed.

[6] Also, in the above-mentioned [5], the element may comprise an N channel FET where a drain electrode and a gate electrode are connected common to the power potential, and a source electrode is connected to the one power terminal.

[7] Also, in the above-mentioned [5], the element may comprise a P channel FET where a source electrode is connected to the power potential, and a drain electrode and a gate electrode are connected common to the one power terminal.

[8] Also, in the above-mentioned [5], the element may comprise a resistor connected to the power potential and the one power terminal.

[9] Also, in the above-mentioned [3], the voltage control circuit may include an N channel FET where a source electrode, a drain electrode, and a gate electrode are respectively connected to the reference potential, one power terminal, and the word line, thereby being turned on only when the word line is on and making a potential of the one power terminal the reference potential, and an element making, when the N channel FET is off, the potential of the one power terminal the potential raised higher than the reference potential by a potential rise of the element itself.

[10] Also, in the above-mentioned [9], the element may comprise an N channel FET where a drain electrode and a gate electrode are connected common to the one power terminal, and a source electrode is connected to the reference potential.

[11] Also, in the above-mentioned [9], the element may comprise a P channel FET where a drain electrode and a gate electrode are connected common to the reference potential, and a source electrode is connected to the one power terminal.

[12] Also, in the above-mentioned [9], the element may comprise a resistor connected to the reference potential and the one power terminal.

[13] Also, in the above-mentioned [4], the voltage control circuit may include an inverter inverting a logical level of the word line, a P channel FET where a source electrode, a drain electrode, and a gate electrode are respectively connected to the power potential, one power terminal, and an output of the inverter, thereby being turned on only when the word line is on and making a potential of the one power terminal the power potential, a first element making, when the P channel FET is off, the potential of the one power terminal the potential dropped lower than the power potential by a voltage drop of the element itself, an N channel FET where a source electrode, a drain electrode, and a gate electrode are respectively connected to the reference potential, the other power terminal, and the word line, thereby being turned on only when the word line is on and making a potential of the other power terminal the reference potential, and a second element making, when the N channel FET is off, the potential of the other power terminal the potential raised higher than the reference potential by a potential rise of the element itself.

[14] Also, in the above-mentioned [13], the first element may comprise an N channel FET where a drain electrode and a gate electrode are connected common to the power potential, and a source electrode is connected to the one power terminal.

[15] Also, in the above-mentioned [13], the first element may comprise a P channel FET where a source electrode is connected to the power potential, and a drain electrode and a gate electrode are connected common to the one power terminal.

[16] Also, in the above-mentioned [13], the first element may comprise a resistor connected to the power potential and the one power terminal.

[17] Also, in the above-mentioned [13], the second element may comprise an N channel FET where a drain electrode and a gate electrode are connected common to the other power terminal, and a source electrode is connected to the reference potential.

[18] Also, in the above-mentioned [13], the second element may comprise a P channel FET where a drain electrode and a gate electrode are connected common to the reference potential, and a source electrode is connected to the other power terminal.

[19] Also, in the above-mentioned [13], the second element may comprise a resistor connected to the reference potential and the other power terminal.

[20] Also, in the above-mentioned [1], the memory macro may further comprise a delay gate delaying a transmission of the logical level of the word line to the memory cell more than that to the voltage control circuit.

Namely, in this case, it becomes possible to reliably switch the power supply in advance of the execution of reading or writing the data from or to the memory cell.

[21] Also, in the above-mentioned [1], the memory macro may further comprise a circuit forcibly turning the logical level of the word line off to be transmitted to the voltage control circuit when writing the data to the memory cell is performed.

Namely, in this case, the voltage supplied to the memory cell can be made low even upon writing the data, so that it is possible to have the memory cell operate at a high speed.

[22] Also, in the above-mentioned [1], the memory macro may further comprise a circuit forcibly turning the logical level of the word line on to be transmitted to the voltage control circuit when the power voltage itself is switched over to the hold enable voltage.

Namely, even when the power voltage may be externally changed like the above-mentioned prior art example [1], it is possible to prevent the voltage supplied to the memory cell from being below the hold enable voltage, thereby enabling the memory cell to be normally operated.

[23] Also, in the above-mentioned [1], the word line and the pair of bit lines may be formed in a grid pattern, and the voltage control circuit may be provided per word line.

Namely, the voltage control circuit has only to be provided per word line even when the memory cells are arranged in a matrix, so that the scale increase of the memory macro can be suppressed.

According to the present invention, it is possible to more largely reduce the leak current of the memory cell in the hold state, thereby reducing the power consumption of the semiconductor integrated circuit or the like on which the memory macro is mounted.

Also, it is made possible to simply configure the voltage control circuit, thereby enabling a high-density mounting of the memory macro and the semiconductor integrated circuit to be realized.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Embodiments [1]-[6] of the memory macro according to the present invention will now be described referring to FIGS. 1-10.

Figure 1:
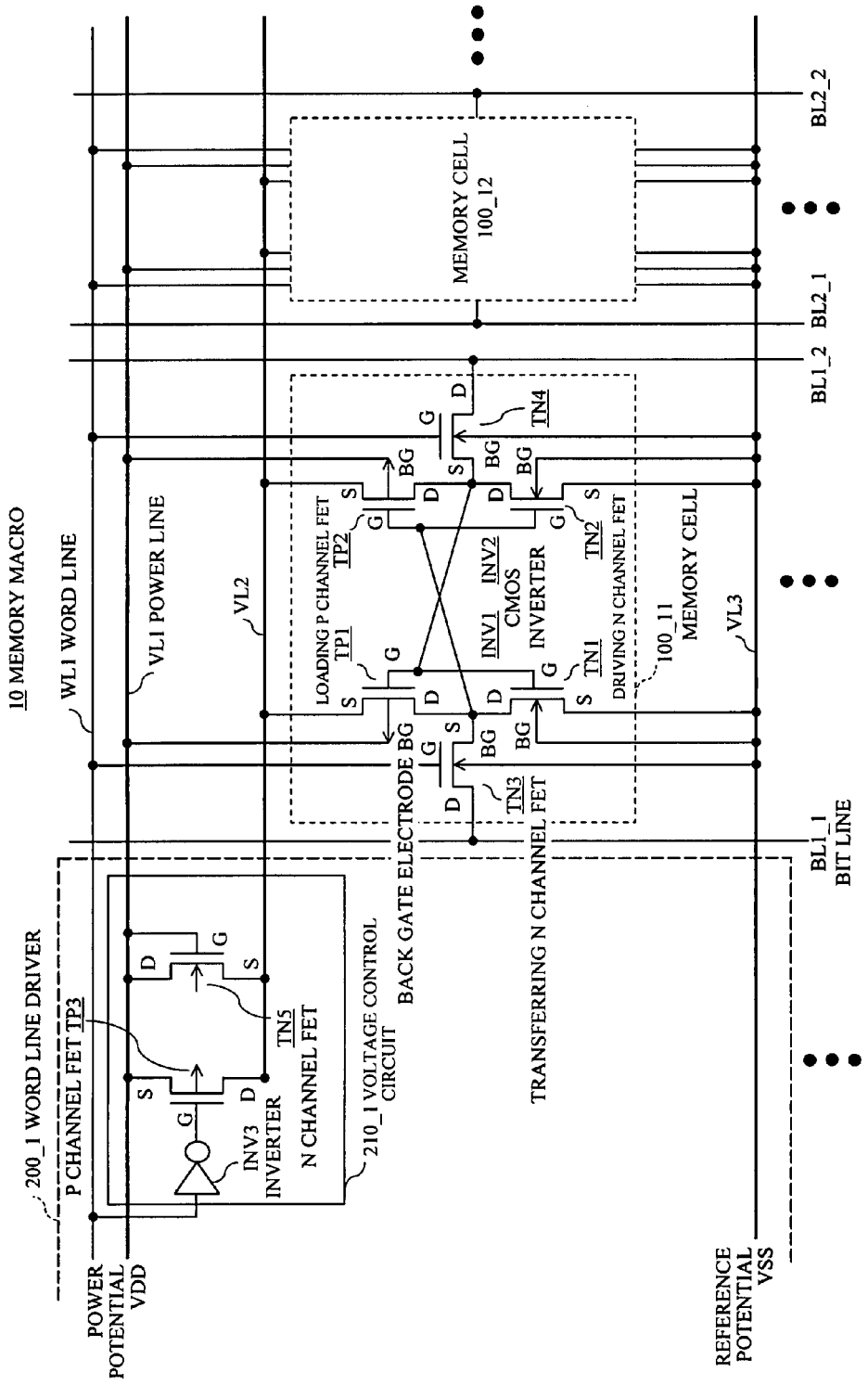
FIG. 1 is a block diagram showing an arrangement of an embodiment [1] of a memory macro according to the present invention.
Figure 2:
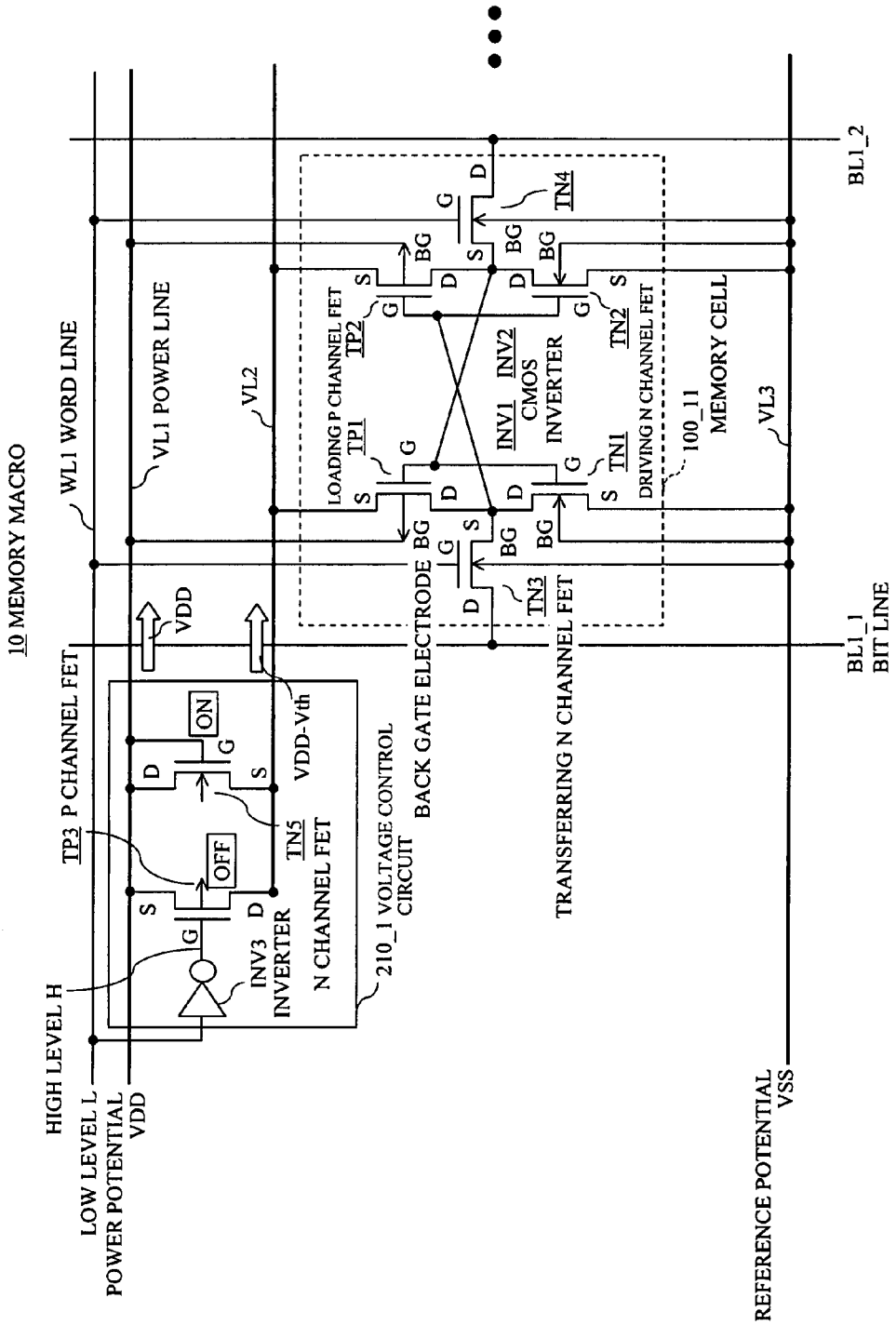
FIG. 2 is a block diagram showing an operation example (1) of an embodiment [1] of a memory macro according to the present invention.
Figure 3:
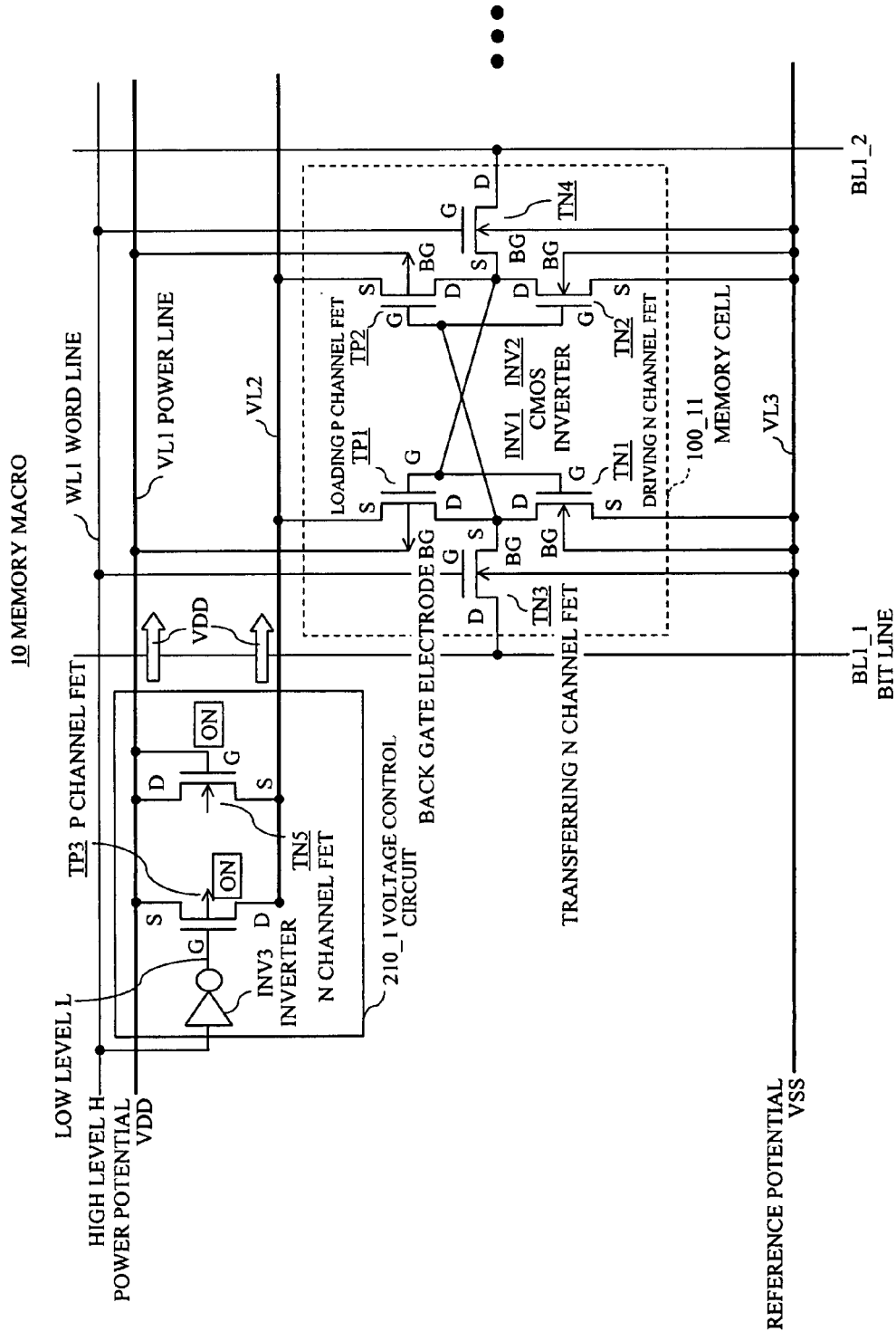
FIG. 3 is a block diagram showing an operation example (2) of an embodiment [1] of a memory macro according to the present invention.

Embodiment [1]: FIGS. 1-3

Figure 12:
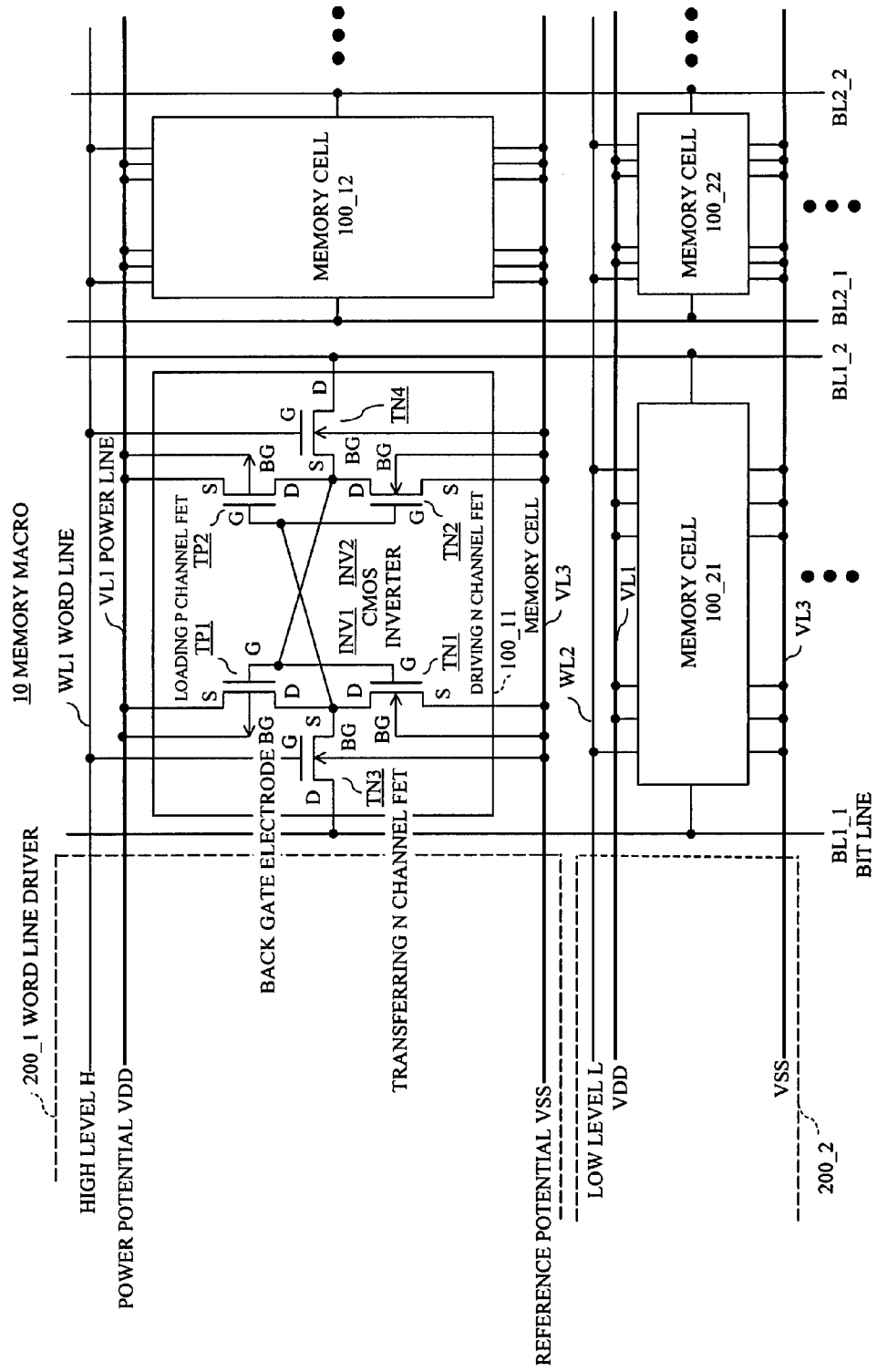
FIG. 12 is a block diagram showing a general arrangement of a memory cell.

A memory macro 10 according to the embodiment [1] of the present invention shown in FIG. 1 is different from that of the prior art example shown in FIG. 12 in that the source electrodes S of the loading P channel FETs TP1 and TP2 within the memory cells 100_11-100_1n of the same row are connected to a power line VL2 newly provided, and a voltage control circuit 210_1 connected to the word line WL1, and the power lines VL1 and VL2 is provided.

Also, the voltage control circuit 210_1 has an inverter INV3 inverting the logical level of the word line WL1, a P channel FET TP3 having a gate electrode G connected to the output of the inverter INV3 and a source electrode S and a drain electrode D connected respectively to the power lines VL1 and VL2, and an N channel FET TN5 having a drain electrode D and a gate electrode G connected common to the power line VL1 and a source electrode S connected to the power line VL2.

It is to be noted that while the word lines WL2-WLm and the memory cells 100_21-100_mn connected thereto shown in FIG. 12 are omitted for the sake of simplifying the figures, the voltage control circuit 210_1 is provided per word line WL in the same way as mentioned above.

An operation of this embodiment will now be described. Firstly, an operation example (1) in the hold state will be described referring to FIG. 2. Then, an operation example (2) in the access state will be described referring to FIG. 3.

OPERATION EXAMPLE (1) (IN HOLD STATE): FIG. 2

As shown in FIG. 2, when the word line WL1 is at the low level L, the inverter INV3 forming the voltage control circuit 210_1 renders the gate electrode G of the P channel FET TP3 the high level H by inverting the input level L thereof.

Then, the P channel FET TP3 is turned off, so that a potential of the power line VL2 is dropped by a potential Vth lower than the power potential VDD as shown in FIG. 2 due to a voltage drop between the D and S electrodes of the N channel FET TN5 which is constantly on.

The potential Vth is a threshold potential of the N channel FET TN5 of which threshold (channel length and channel width etc.) is set to prevent a potential difference between the power line VL2 and the power line VL3 from being below the hold enable voltage.

Thus, while the voltage supplied to the memory cells 100_11-100_1n assumes the hold enable voltage, the potential of the back gate electrodes BG of the loading P channel FETs TP1 and TP2 remains at the power potential VDD. Therefore, the low bias effect on the CMOS inverters INV1 and INV2, and the substrate bias effect on the loading P channel FETs TP1 and TP2 can be achieved.

It is to be noted that the N channel FET TN5 can be replaced with a P channel FET having a source electrode connected to the power line VL1 and a drain electrode and a gate electrode connected common to the power line VL2, or a resistor connecting the power lines VL1 and VL2. Also in this case, the above-mentioned description is similarly applied.

OPERATION EXAMPLE (2) (IN ACCESS STATE): FIG. 3

As shown in FIG. 3, when the word line WL1 is at the high level H, the inverter INV3 renders the gate electrode G of the P channel FET TP3 the low level L by inverting the input level H thereof.

It is designed that the P channel FET TP3 is then turned on and prevents the substantial voltage drop from occurring between the D and S electrodes, so that the power lines VL1 and VL2 are shorted and the potentials of the power lines VL1 and VL2 concurrently and substantially assume the power potential VDD. In this case, the potentials of the power lines VL1 and VL2 are equal to each other, so that the N channel FET TN5 is substantially made off with no influence at all.

Thus, the normal power voltage is supplied to the memory cells 100_11-100_1n. Therefore, the read or write operation can be normally performed.

Figure 4:
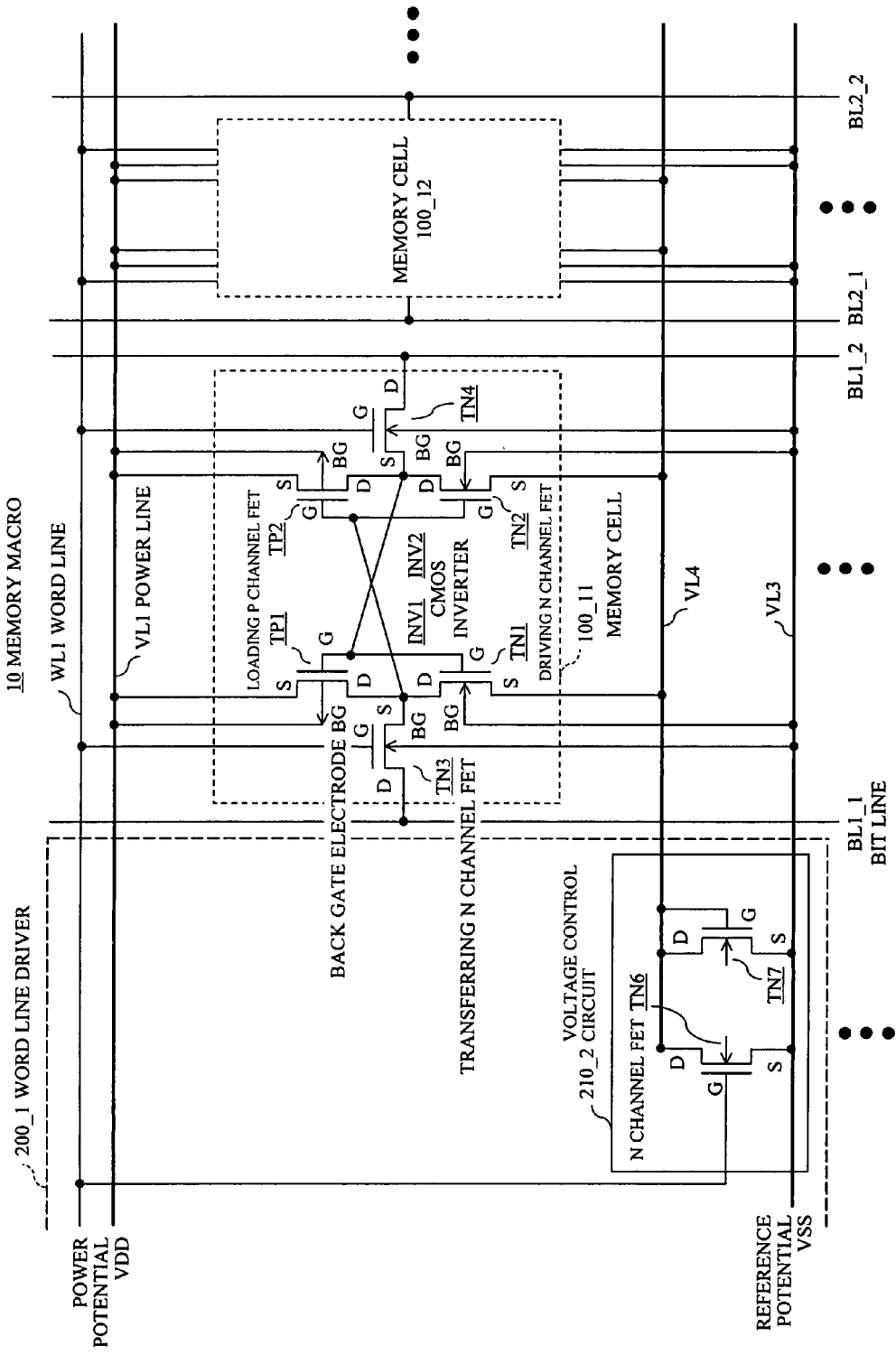
FIG. 4 is a block diagram showing an arrangement of an embodiment [2] of a memory macro according to the present invention.
Figure 5:
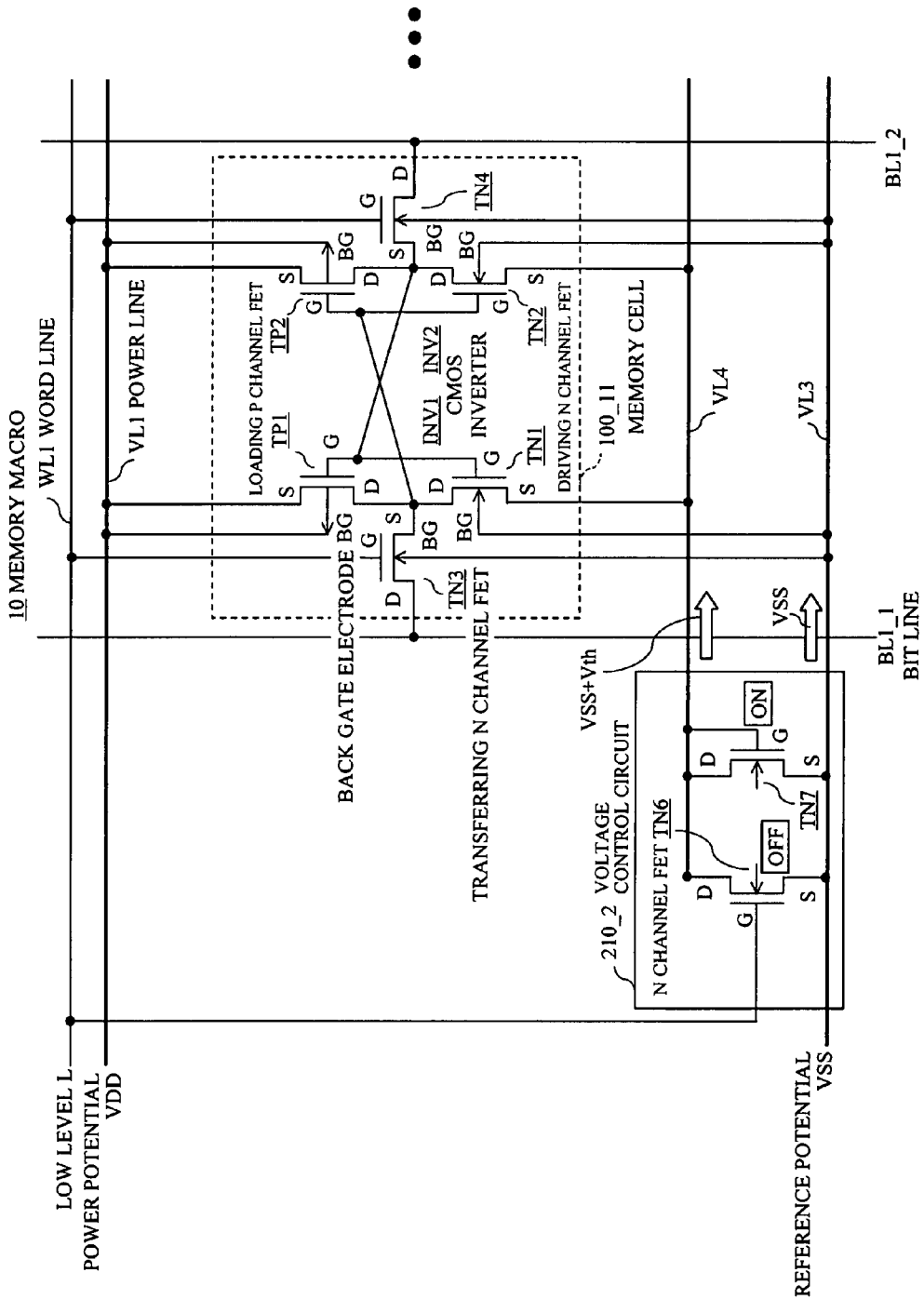
FIG. 5 is a block diagram showing an operation example (1) of an embodiment [2] of a memory macro according to the present invention.
Figure 6:
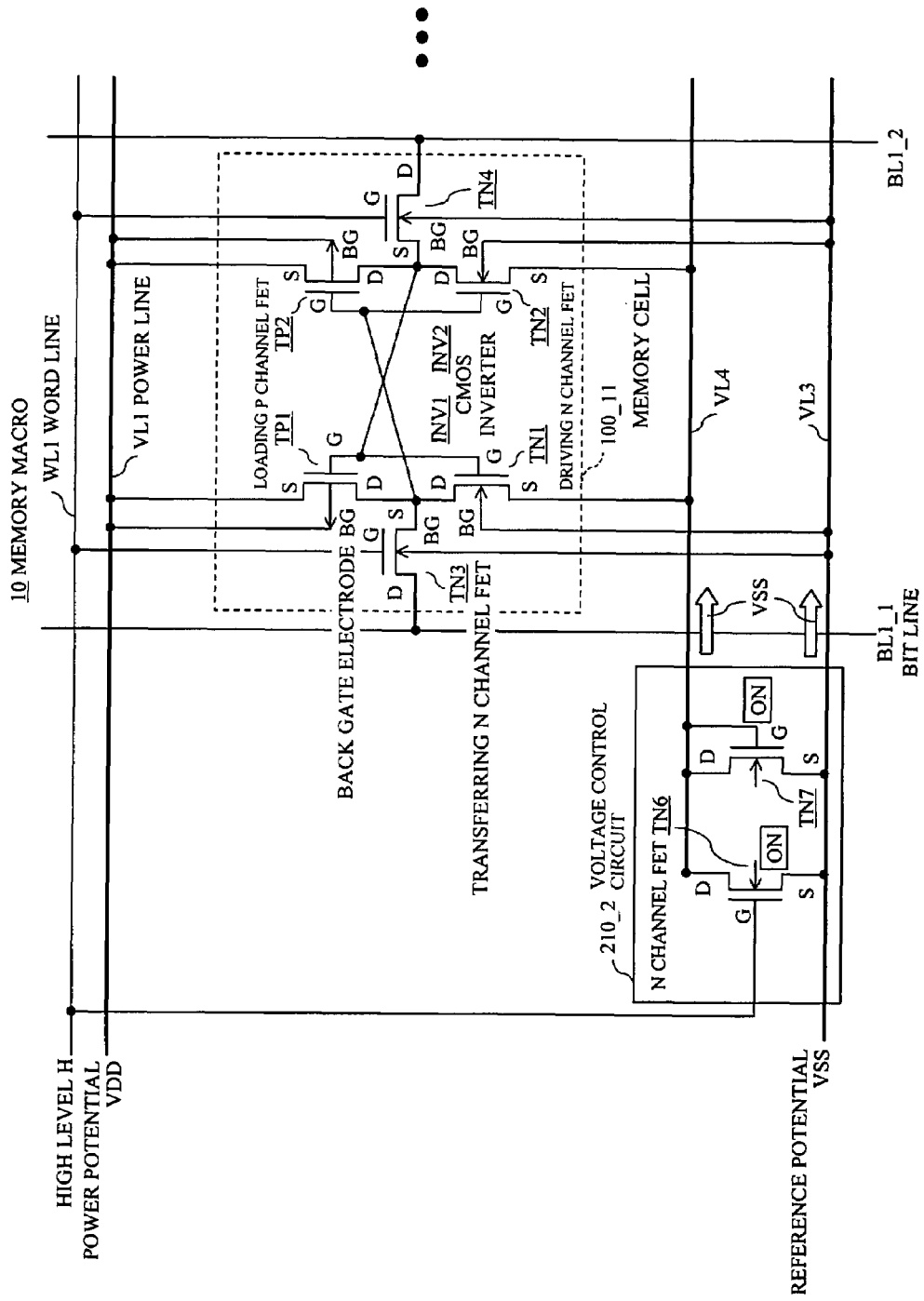
FIG. 6 is a block diagram showing an operation example (2) of an embodiment [2] of a memory macro according to the present invention.

Embodiment [2]: FIGS. 4-6

A memory macro 10 according to the embodiment [2] of the present invention shown in FIG. 4 is different from that of the prior art example shown in FIG. 12 in that the source electrodes S of the driving N channel FETs TN1 and TN2 within the memory cells 100_11-100_1n of the same row are connected to a power line VL4 newly provided, and a voltage control circuit 210_2 connected to the word line WL1, and the power lines VL3 and VL4 is provided.

Also, the voltage control circuit 210_2 has an N channel FET TN6 having a source electrode S, a drain electrode D, and a gate electrode G connected respectively to the power lines VL3 and VL4, and the word line WL1, and an N channel FET TN7 having a drain electrode D and a gate electrode G connected common to the power line VL4 and a source electrode S connected to the power line VL3.

An operation of this embodiment will now be described. Firstly, an operation example (1) in the hold state will be described referring to FIG. 5. Then, an operation example (2) in the access state will be described referring to FIG. 6.

OPERATION EXAMPLE (1) (IN HOLD STATE): FIG. 5

As shown in FIG. 5, when the word line WL1 is at the low level L, the N channel FET TN6 forming the voltage control circuit 210_2 is turned off. Therefore, the potential of the power line VL4 is raised by a potential Vth higher than the reference potential VSS as shown in FIG. 5 due to a potential rise between the D and S electrodes of the N channel FET TN7 which is constantly on.

The potential Vth is a threshold potential of the N channel FET TN7 of which threshold is set to prevent a potential difference between the power line VL1 and the power line VL4 from being below the hold enable voltage.

Thus, while the voltage supplied to the memory cells 100_11-100_1n respectively assumes the hold enable voltage, the potential of the back gate electrodes BG of the driving N channel FETs TN1 and TN2 remains at the reference potential VSS. Therefore, the low bias effect and the substrate bias effect can be achieved in the same way as the above-mentioned embodiment [1].

It is to be noted that the N channel FET TN7 can be replaced with a P channel FET having a drain electrode and a gate electrode connected common to the power line VL4 and a source electrode connected to the power line VL3, or a resistor connecting the power lines VL3 and VL4. Also in this case, the above-mentioned description is similarly applied.

OPERATION EXAMPLE (2) (IN ACCESS STATE): FIG. 6

As shown in FIG. 6, it is designed that when the word line WL1 is at the high level H, the N channel FET TN6 is turned on, preventing the substantial potential rise from occurring between the D and S electrodes. Therefore, the potentials of the power lines VL3 and VL4 concurrently and substantially assume the reference potential VSS. In this case, since the potentials of the power lines VL3 and VL4 are equal to each other, the N channel FET TN7 is substantially made off with no influence at all.

Thus, the normal power voltage is supplied to the memory cells 100_11-100_1n. Therefore, it is possible to normally perform the read or write operation in the same way as the above-mentioned embodiment [1].

Figure 7:
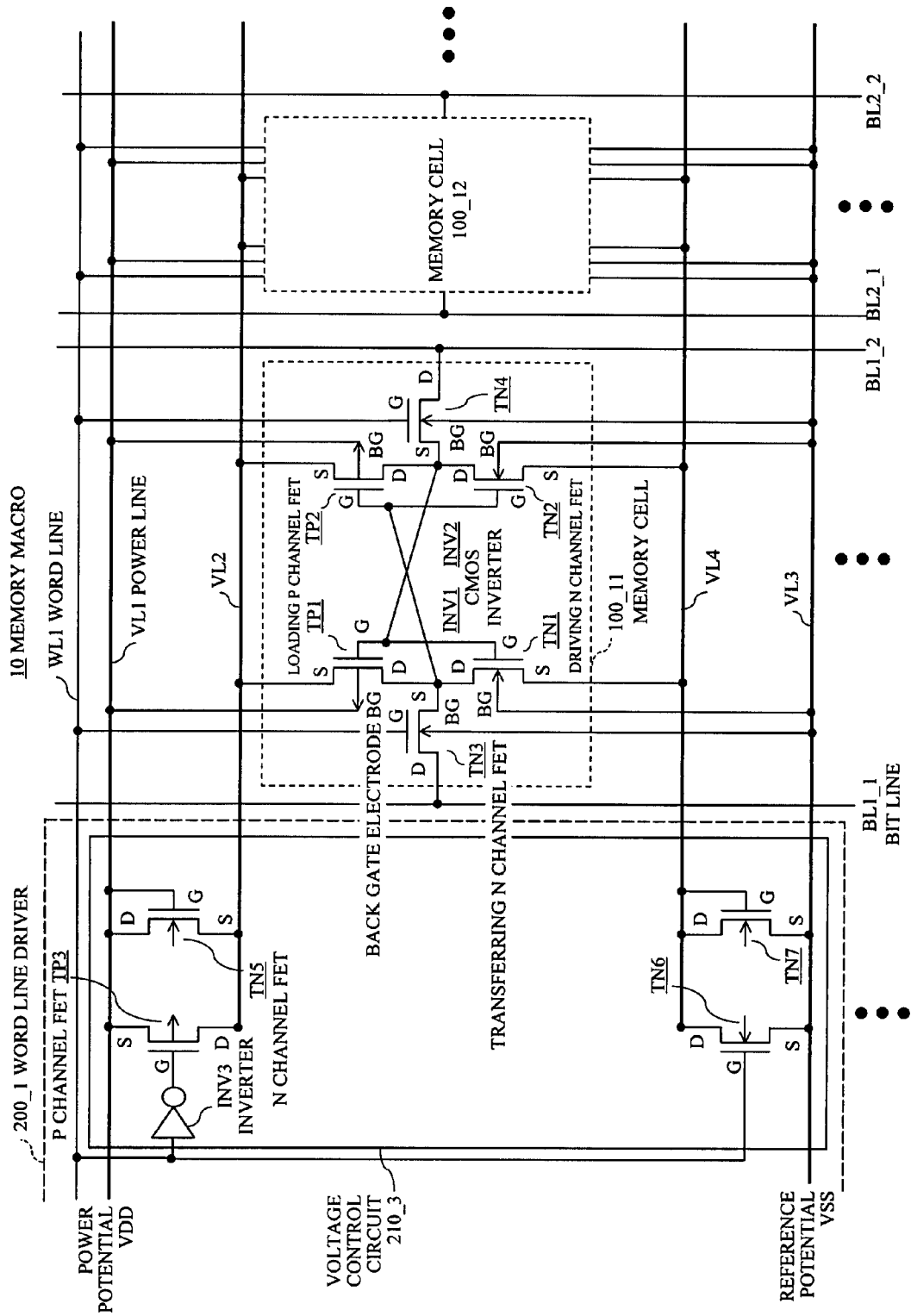
FIG. 7 is a block diagram showing an arrangement of an embodiment [3] of a memory macro according to the present invention.

Embodiment [3]: FIG. 7

In a memory macro 10 according to the embodiment [3] of the present invention shown in FIG. 4, the source electrodes S of the loading P channel FETs TP1 and TP2 within the memory cells 100_11-100_1n are connected to the power line VL2 and the source electrodes S of the driving N channel FETs TN1 and TN2 are connected to the power line VL4 in the same way as the above-mentioned embodiments [1] and [2]. However, different from the above-mentioned embodiments [1] and [2], a voltage control circuit 210_3 connected to the word line WL1 and the power lines VL1-VL4 is provided.

In operation, the P channel FET TP3 and the N channel FET TN6 forming the voltage control circuit 210_3 are concurrently turned off in the hold state as respectively shown in FIGS. 2 and 5. Therefore, the potential of the power line VL2 is dropped lower than the power potential VDD due to the voltage drop of the N channel FET TN5 and the potential of the power line VL4 is raised higher than the reference potential VSS due to the potential rise of the N channel FET TN7.

The N channel FETs TN5 and TN7 of which respective thresholds are set to prevent a potential difference between the power line VL2 and the power line VL4 from being below the hold enable voltage are used.

Thus, the hold enable voltage is supplied to the memory cells 100_11-100_1n, so that the low bias effect can be achieved in the same way as the above-mentioned embodiments [1] and [2]. Also, the potential of the back gate electrodes BG of the loading P channel FETs TP1 and TP2, and the potential of the back gate electrodes BG of the driving N channel FETs TN1 and TN2 respectively remain at the power potential VDD and the reference potential VSS. Therefore, the substrate bias effect on both of the loading P channel FETs and the driving N channel FETs can be achieved.

On the other hand, in the access state, the potential of the power lines VL1 and VL2, and the potential of the power lines VL3 and VL4 respectively assume the power potential VDD and the reference potential VSS as respectively shown in FIGS. 3 and 6. Therefore, the normal power voltage is supplied to the memory cells 100_11-100_1n, so that the read or write operation can be normally performed in the same way as the above-mentioned embodiments [1] and [2].

It is to be noted that as described in the above-mentioned embodiments [1] and [2], the P channel FETs or the resistors can be respectively substituted for the N channel FETs TN5 and TN7.

Figure 8:
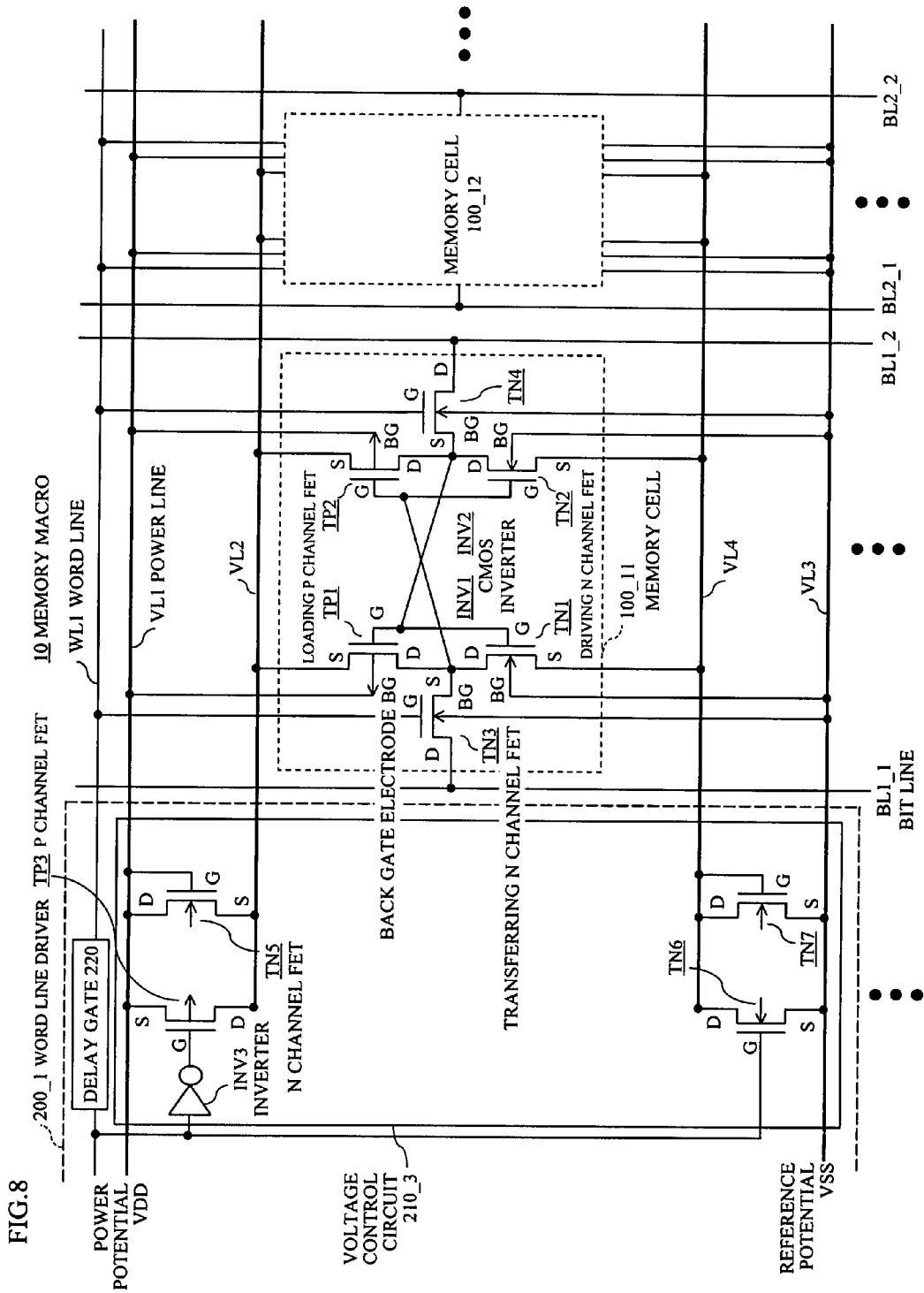
FIG. 8 is a block diagram showing an arrangement of an embodiment [4] of a memory macro according to the present invention.

Embodiment [4]: FIG. 8

A memory macro 10 according to the embodiment [4] of the present invention shown in FIG. 8 has, in addition to the arrangement of the above-mentioned embodiment [3], a delay gate 220 provided in parallel with the voltage control circuit 210_3 within the word line WL1.

It is to be noted that while the delay gate 220 can be also provided in the arrangements of the above-mentioned embodiments [1] and [2], the following description can be similarly applied.

In operation, a travel of the logical level of the word line WL1 is delayed at the delay gate 220. Therefore, before the transferring N channel FETs TN3 and TN4 within the memory cells 100_11-100_1n are turned on or off, the switchover of the power supply described in the above-mentioned embodiment [3] is performed in the voltage control circuit 210_3.

Thus, the voltage respectively suitable for the hold state or the access state is reliably supplied to the memory cells 100_11-100_1n, which can normally operate.

Figure 9:
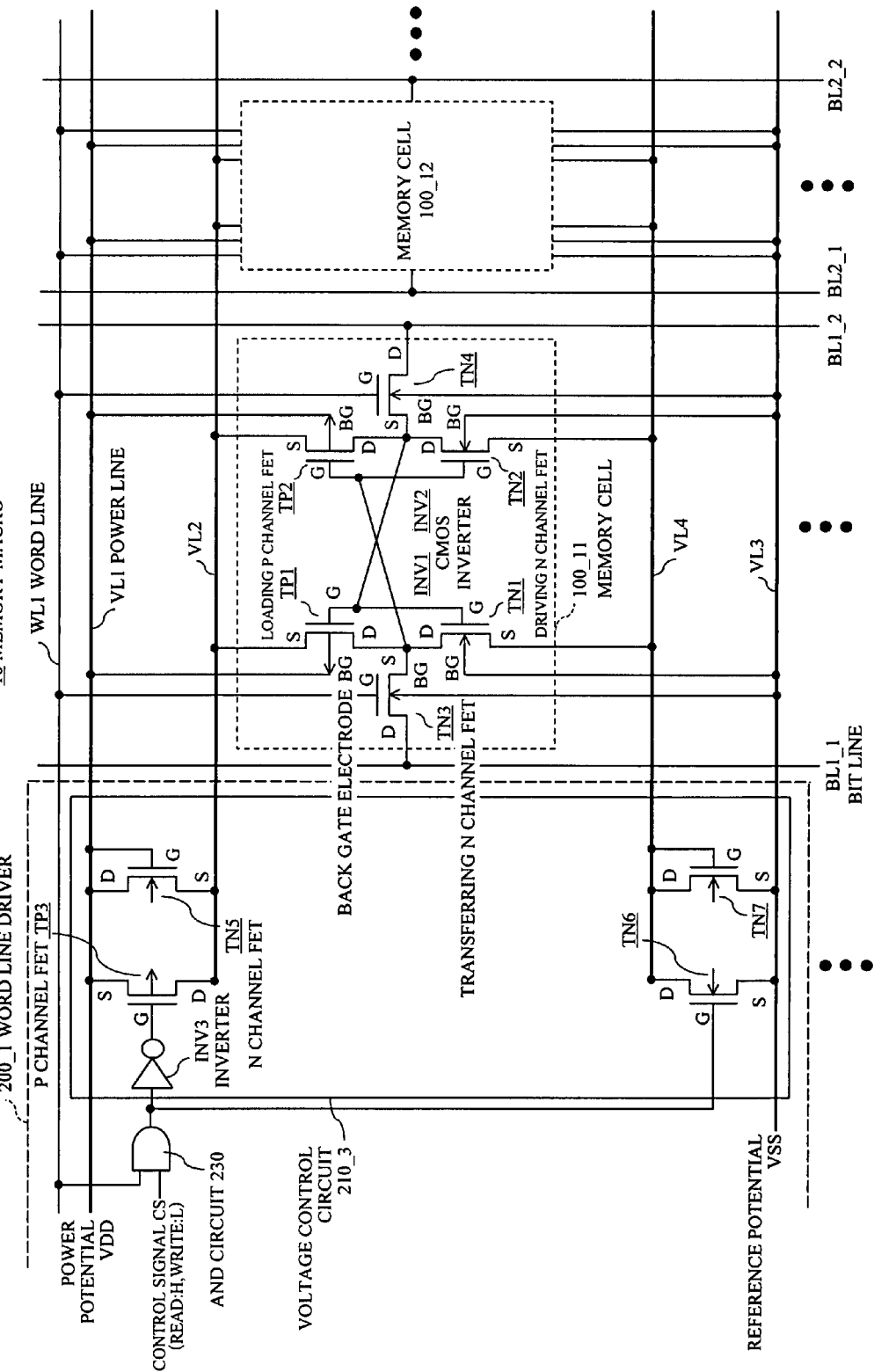
FIG. 9 is a block diagram showing an arrangement of an embodiment [5] of a memory macro according to the present invention.

Embodiment [5]: FIG. 9

A memory macro 10 according to the embodiment [5] of the present invention shown in FIG. 9 has, in addition to the arrangement of the above-mentioned embodiment [3], an AND circuit 230 where one input terminal is connected to the word line WL1, a control signal CS is received at the other input terminal, and an output terminal is connected to the voltage control circuit 210_3.

The control signal CS indicates the high level H when reading the data from the memory cells 100_11-100_1n is performed, and indicates the low level L when writing is performed. The control signal CS is generated by e.g. an input signal from the outside of the memory macro.

Namely, when the reading is performed from the memory cells 100_11-100_1n, the high level H is concurrently received at both input terminals of the AND circuit 230, so that the output of the AND circuit 230 becomes the high level H. In this case, the operation of the voltage control circuit 210_3 is same as that in the access state described in the above-mentioned embodiment [3], so that the voltage supplied to the memory cells 100_11-100_1n assumes the normal power voltage. Therefore, the data reading can be normally performed.

On the other hand, when the writing is performed to the memory cells 100_11-100_1n, logical levels of both input terminals of the AND circuit 230 are different from each other, so that the output of the AND circuit 230 becomes the low level L. In this case, the operation of the voltage control circuit 210_3 is same as that in the hold state, so that the voltage supplied to the memory cells 100_11-100_1n assumes the hold enable voltage. Therefore, the data writing can be performed at a high speed.

Figure 10:
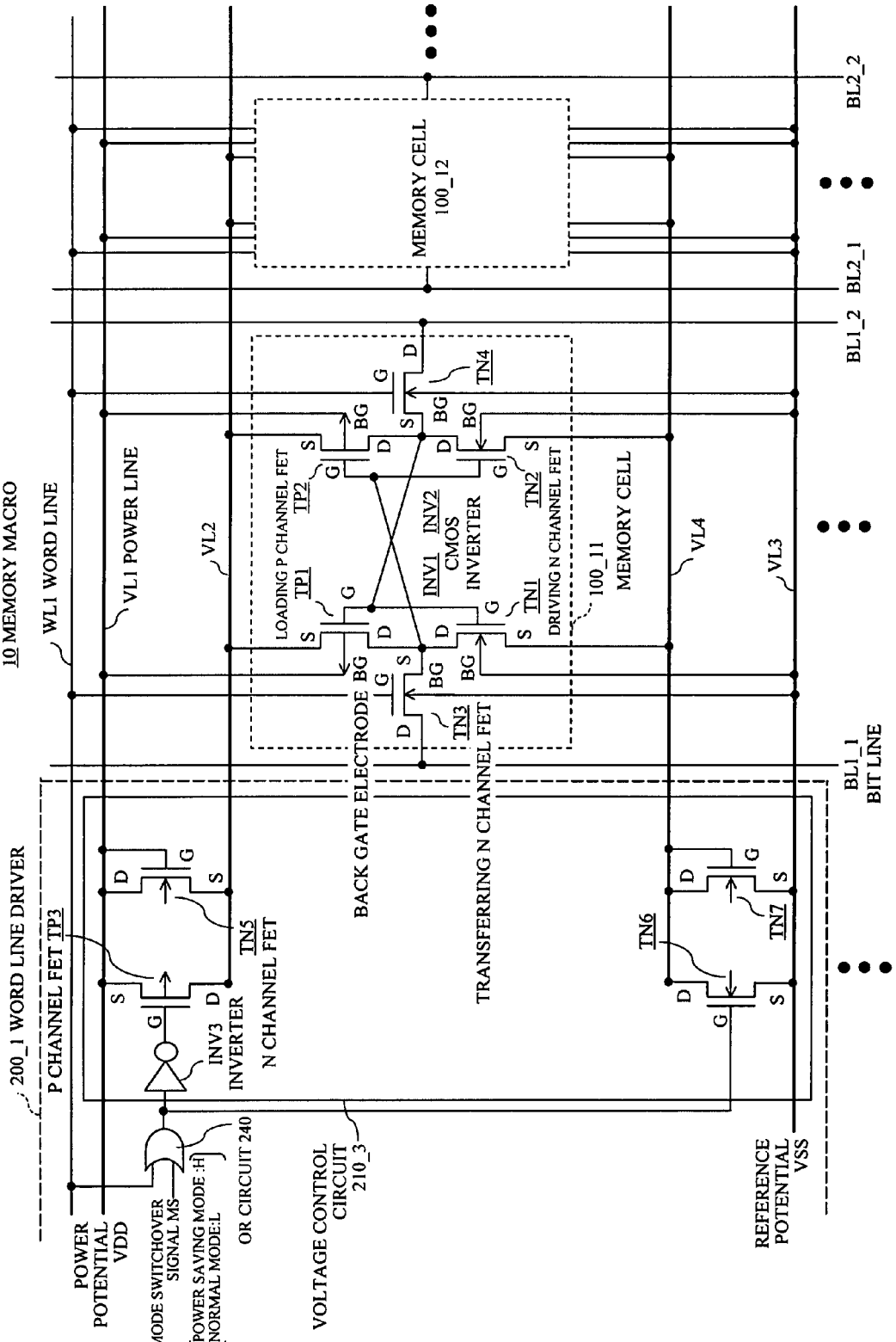
FIG. 10 is a block diagram showing an arrangement of an embodiment [6] of a memory macro according to the present invention.

Embodiment [6]: FIG. 10

A memory macro 10 according to the embodiment [6] of the present invention shown in FIG. 10 has, in addition to the arrangement of the above-mentioned embodiment [3], an OR circuit 240 where one input terminal is connected to the word line WL1, a mode switchover signal MS is received at the other input terminal, and an output terminal is connected to the voltage control circuit 210_3.

Figure 11:
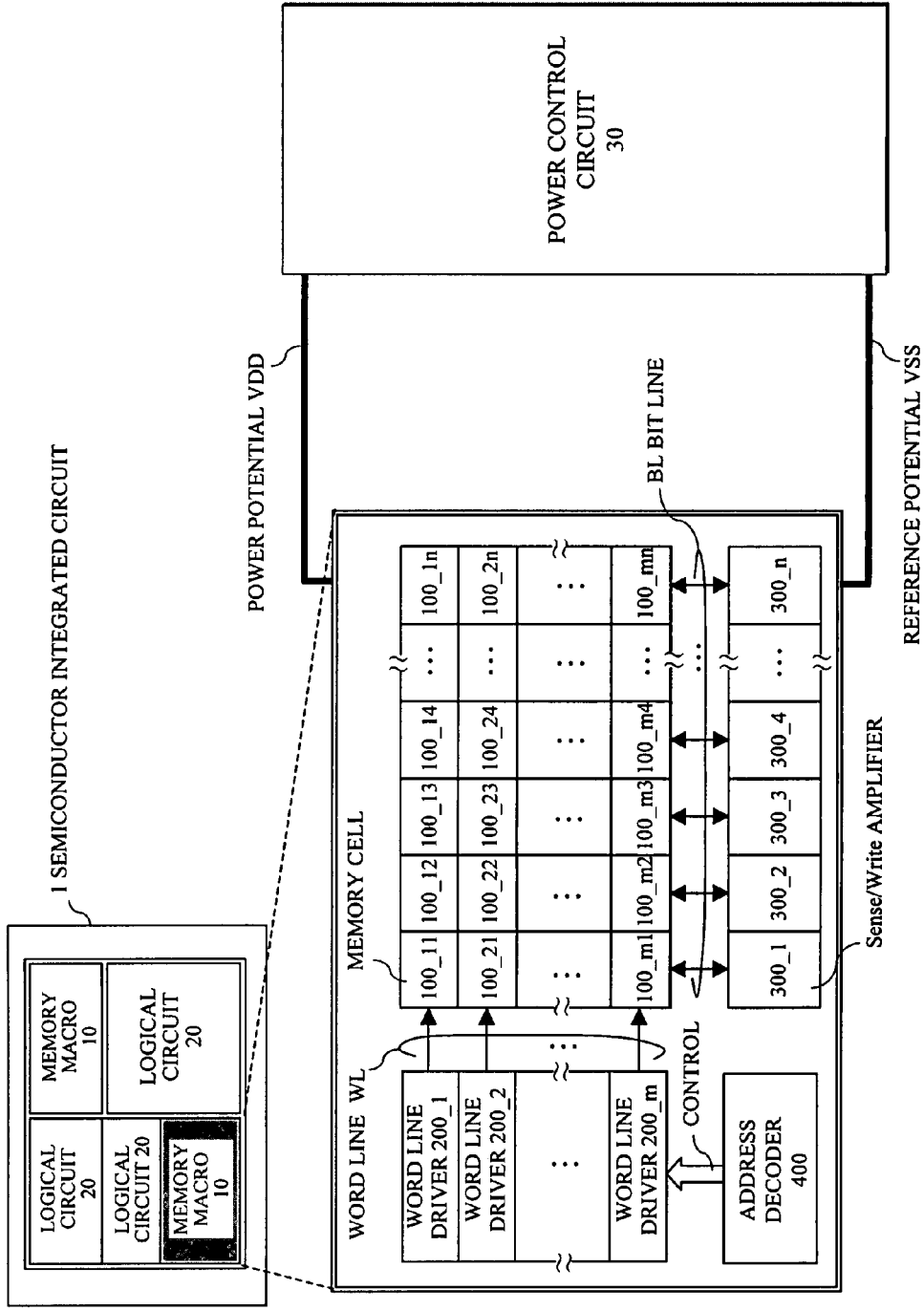
FIG. 11 is a block diagram showing a general arrangement of a memory macro.

The mode switchover signal MS exhibits the high level H when the whole memory macro 10 is in the hold state where none of the memory cells 100 is in the access state (hereinafter, referred to as power saving mode), otherwise (upon normal mode) exhibiting the low level L. Also, the mode switchover signal MS is generated by a detector (not shown) provided within the memory macro 10. The detector transits to the power saving mode to assume the high level H when detecting that the power voltage itself has been switched over to the hold enable voltage by the power control circuit 30 shown in FIG. 11 or the like, and transits to the normal mode to assume the low level L when detecting that the power voltage has been restored to the original voltage value.

Namely, since one of the inputs of the OR circuit 240 constantly becomes the high level H regardless of the logical level of the word line WL1 in the power saving mode, the output of the OR circuit 240 constantly becomes the low level H.

In this case, the voltage control circuit 230_3 respectively equalizes the potential of the power line VL1 with that of the VL2, and the potential of the power line VL3 with that of the VL4 in the same way as that in the access state in the above-mentioned embodiment [3]. However, in fact, the potential difference between the power lines VL2 and VL4 assumes the hold enable voltage in the same way as that in the hold state, so that the power supply to the memory cells 100_11-100_1n may not be below the hold enable voltage even in the power saving mode.

It is to be noted that the present invention is not limited by the above-mentioned embodiments, and it is obvious that various modifications may be made by one skilled in the art based on the recitation of the claims.

What is claimed is:

1. A memory macro comprising:
   a memory cell forming a flip-flop circuit with a pair of CMOS inverters connected to a word line and a pair of bit lines; and
   a voltage control circuit supplying a predetermined power voltage across power terminals of each CMOS inverter when the word line is on, supplying a hold enable voltage which is lower than the predetermined power voltage and equal to or higher than a lower limit voltage for enabling data to be held across the power terminals when the word line is turned off, and supplying the predetermined power voltage across a back gate electrode of one FET and a back gate electrode of the other FET within each CMOS inverter either when the word line is on or off.

2. The memory macro as claimed in claim 1, wherein the voltage control circuit provides a potential dropped lower than a potential on a high potential end of the predetermined power voltage and a reference potential on a low potential end of the predetermined power voltage as the hold enable voltage.

3. The memory macro as claimed in claim 1, wherein the voltage control circuit provides a potential on a high potential end of the predetermined power voltage and a potential raised higher than a reference potential on a low potential end of the predetermined power voltage as the hold enable voltage.

4. The memory macro as claimed in claim 1 wherein the voltage control circuit provides a potential dropped lower than a power potential on a high potential end of the power voltage and a potential raised higher than a reference potential on a low potential end of the power voltage as the hold enable voltage, and the back gate electrode of the one FET is connected to the power potential and a back gate electrode of the other FET is connected to the reference potential.

5. The memory macro as claimed in claim 2, wherein the voltage control circuit includes an inverter inverting a logical level of the word line,
   a P channel FET where a source electrode, a drain electrode, and a gate electrode are respectively connected to the power potential, one power terminal, and an output of the inverter, thereby being turned on only when the word line is on and making a potential of the one power terminal the power potential, and
   an element making, when the P channel FET is off, the potential of the one power terminal the potential dropped lower than the power potential by a voltage drop of the element itself.

6. The memory macro as claimed in claim 5, wherein the element comprises an N channel FET where a drain electrode and a gate electrode are connected common to the power potential, and a source electrode is connected to the one power terminal.

7. The memory macro as claimed in claim 5, wherein the element comprises a P channel FET where a source electrode is connected to the power potential, and a drain electrode and a gate electrode are connected common to the one power terminal.

8. The memory macro as claimed in claim 5, wherein the element comprises a resistor connected to the power potential and the one power terminal.

9. The memory macro as claimed in claim 3, wherein the voltage control circuit includes an N channel FET where a source electrode, a drain electrode, and a gate electrode are respectively connected to the reference potential, one power terminal, and the word line, thereby being turned on only when the word line is on and making a potential of the one power terminal the reference potential, and
   an element making, when the N channel FET is off, the potential of the one power terminal the potential raised higher than the reference potential by a potential rise of the element itself.

10. The memory macro as claimed in claim 9, wherein the element comprises an N channel FET where a drain electrode and a gate electrode are connected common to the one power terminal, and a source electrode is connected to the reference potential.

11. The memory macro as claimed in claim 9, wherein the element comprises a P channel FET where a drain electrode and a gate electrode are connected common to the reference potential, and a source electrode is connected to the one power terminal.

12. The memory macro as claimed in claim 9, wherein the element comprises a resistor connected to the reference potential and the one power terminal.

13. The memory macro as claimed in claim 4, wherein the voltage control circuit includes an inverter inverting a logical level of the word line,
   a P channel FET where a source electrode, a drain electrode, and a gate electrode are respectively connected to the power potential, one power terminal, and an output of the inverter, thereby being turned on only when the word line is on and making a potential of the one power terminal the power potential,
   a first element making, when the P channel FET is off, the potential of the one power terminal the potential dropped lower than the power potential by a voltage drop of the element itself,
   an N channel FET where a source electrode, a drain electrode, and a gate electrode are respectively connected to the reference potential, the other power terminal, and the word line, thereby being turned on only when the word line is on and making a potential of the other power terminal the reference potential, and
   a second element making, when the N channel FET is off, the potential of the other power terminal the potential raised higher than the reference potential by a potential rise of the element itself.

14. The memory macro as claimed in claim 13, wherein the first element comprises an N channel FET where a drain electrode and a gate electrode are connected common to the power potential, and a source electrode is connected to the one power terminal.

15. The memory macro as claimed in claim 13, wherein the first element comprises a P channel FET where a source electrode is connected to the power potential, and a drain electrode and a gate electrode are connected common to the one power terminal.

16. The memory macro as claimed in claim 13, wherein the first element comprises a resistor connected to the power potential and the one power terminal.

17. The memory macro as claimed in claim 13, wherein the second element comprises an N channel FET where a drain electrode and a gate electrode are connected common to the other power terminal, and a source electrode is connected to the reference potential.

18. The memory macro as claimed in claim 13, wherein the second element comprises a P channel FET where a drain electrode and a gate electrode are connected common to the reference potential, and a source electrode is connected to the other power terminal.

19. The memory macro as claimed in claim 13, wherein the second element comprises a resistor connected to the reference potential and the other power terminal.

20. The memory macro as claimed in claim 1, further comprising a delay gate delaying a transmission of the logical level of the word line to the memory cell more than that to the voltage control circuit.

21. The memory macro as claimed in claim 1, further comprising a circuit forcibly turning the logical level of the word line off to be transmitted to the voltage control circuit when writing the data to the memory cell is performed.

22. The memory macro as claimed in claim 1, further comprising a circuit forcibly turning the logical level of the word line on to be transmitted to the voltage control circuit when the power voltage itself is switched over to the hold enable voltage.

23. The memory macro as claimed in claim 1, wherein the word line and the pair of bit lines are formed in a grid pattern, and the voltage control circuit is provided per word line.

* * * * *